(12) United States Patent
Cruz-Uribe et al.

(10) Patent No.: US 8,567,027 B2
(45) Date of Patent: Oct. 29, 2013

(54) PIEZOELECTRIC PRINTHEAD AND RELATED METHODS

(75) Inventors: Tony S Cruz-Uribe, Corvallis, OR (US); Kurl Ulmer, Vancouver, WA (US); Adel Jilani, Corvallis, OR (US); Haggai Karlinski, Ramat Chen Israel (IL); Peter Mardilovich, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/346,289

(22) Filed: Jan. 9, 2012

(65) Prior Publication Data

US 2012/0102695 A1    May 3, 2012

Related U.S. Application Data

(62) Division of application No. 12/550,444, filed on Aug. 31, 2009, now Pat. No. 8,118,410.

(51) Int. Cl.
*B41J 2/045* (2006.01)
*H01L 41/22* (2013.01)

(52) U.S. Cl.
USPC ........................................................ 29/25.35

(58) Field of Classification Search
None
See application file for complete search history.

(56) References Cited

U.S. PATENT DOCUMENTS

| | | | |
|---|---|---|---|
| 6,450,626 B2 * | 9/2002 | Ikeda et al. | 347/70 |
| 6,808,254 B2 | 10/2004 | Sakaida et al. | |
| 6,811,248 B2 | 11/2004 | Matsuo et al. | |
| 6,973,703 B2 | 12/2005 | Sakaida et al. | |
| 6,979,074 B2 | 12/2005 | Watanabe et al. | |
| 6,994,428 B2 | 2/2006 | Ito | |
| 7,237,876 B2 | 7/2007 | Hirota | |
| 2004/0113995 A1 | 6/2004 | Yuu et al. | |
| 2005/0052504 A1 * | 3/2005 | Murai | 347/71 |
| 2005/0052506 A1 | 3/2005 | Yagi et al. | |
| 2006/0092239 A1 | 5/2006 | Sung et al. | |

* cited by examiner

*Primary Examiner* — Lisa M Solomon
(74) *Attorney, Agent, or Firm* — Nathan R. Rieth

(57) ABSTRACT

A piezoelectric printhead and related methods provide a first metallic electrode and a second metallic electrode deposited over a top surface and a bottom surface, respectively, of a piezoceramic plate. The second electrode is segmented into a plurality of electrode segments. A diaphragm is positioned over a plurality of pressure chambers, where the diaphragm includes a conductor positioned over each chamber. The piezoceramic plate is attached to the diaphragm such that each conductor on the diaphragm faces multiple electrode segments.

7 Claims, 18 Drawing Sheets

PIEZOELECTRIC PRINTHEAD AND RELATED METHODS

CROSS-REFERENCE TO RELATED APPLICATIONS

This application is a Divisional of U.S. patent application Ser. No. 12/550,444 filed Aug. 31, 2009, now granted U.S. Pat. No. 8,118,410.

BACKGROUND

Conventional drop-on-demand inkjet printers are commonly categorized based on one of two mechanisms of drop formation. A thermal bubble inkjet printer uses a heating element actuator in an ink-filled chamber to vaporize ink and create a bubble which forces an ink drop out of a nozzle. A piezoelectric inkjet printer uses a piezoelectric material actuator on a wall of an ink-filled chamber to generate a pressure pulse which forces a drop of ink out of the nozzle. Piezoelectric printheads may have several advantages over thermal printheads including that, for example, they jet a wide range of ink formulations, they do not raise the temperature of the ink significantly which can cause drying of the ink in the nozzle, they have a longer working life, and the deformation of the piezoelectric ceramic material responds proportionally to voltage changes unlike bubble generators and therefore may produce multiple drop sizes, as well as limit the formation of unwanted satellite drops, which enables more control over the quality of the printed document.

A convenient way of constructing an array of piezoelectric actuators for an inkjet printhead is to bond a single piezoceramic plate (or sheet) onto a diaphragm plate (or sheet) covering a corresponding array of pressure chambers. The piezoceramic plate has a single common electrode on one side and a number of individual electrodes on the other side, each individual electrode corresponding with the location and shape of an associated pressure chamber. For each individual electrode on the piezoceramic plate, there is a matching conductor on the diaphragm over the associated chamber. Subsequent to bonding the piezoceramic plate to the diaphragm, portions of the piezoceramic plate including electrodes on one or both surfaces not over the conductor may be removed. The problem with this way of constructing the array of piezoelectric actuators over the pressure chambers relates to the accuracy with which the individual electrodes on the piezoceramic plate can be located with respect to the diaphragm conductors and pressure chambers when the piezoceramic plate is bonded to the diaphragm. That is, if the piezoceramic plate is not located over the diaphragm in a precise manner, the individual electrodes on the piezoceramic plate will not be properly aligned with their respective diaphragm conductors and pressure chambers. As a result, a portion of the piezoceramic plate not centered over the pressure chamber will be actuated. Thus, deviations in the alignment result in less output from the actuator, pressure pulses that are not spatially symmetric, and possible short circuiting of electrodes between neighboring chambers.

BRIEF DESCRIPTION OF THE DRAWINGS

The present embodiments will now be described, by way of example, with reference to the accompanying drawings, in which.

DETAILED DESCRIPTION

Overview of Problem and Solution

Figure 1A:
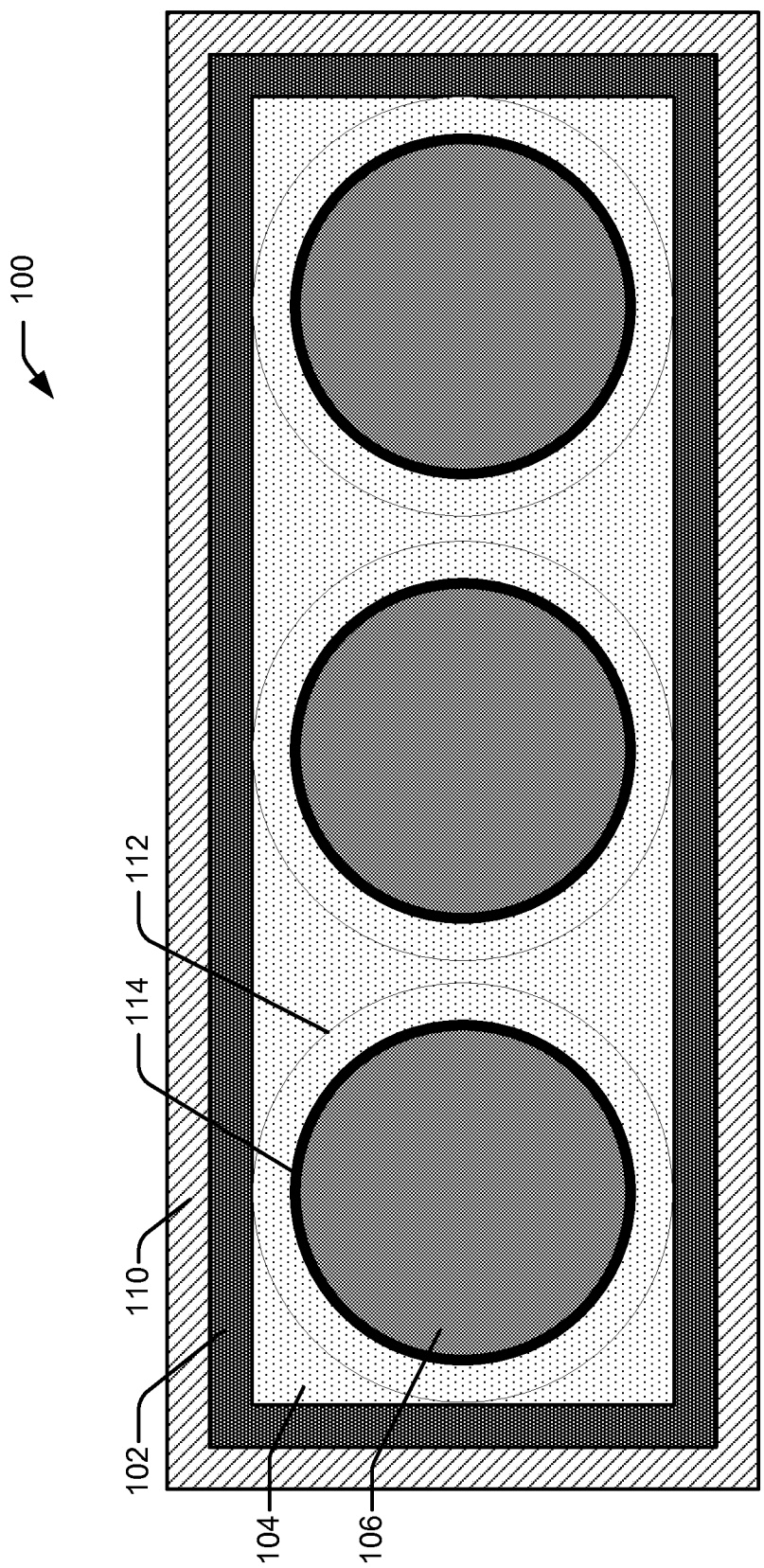
FIGS. 1A-E show a partial array of piezoceramic actuators in a piezoelectric inkjet printhead according to the prior art.
Figure 1B:
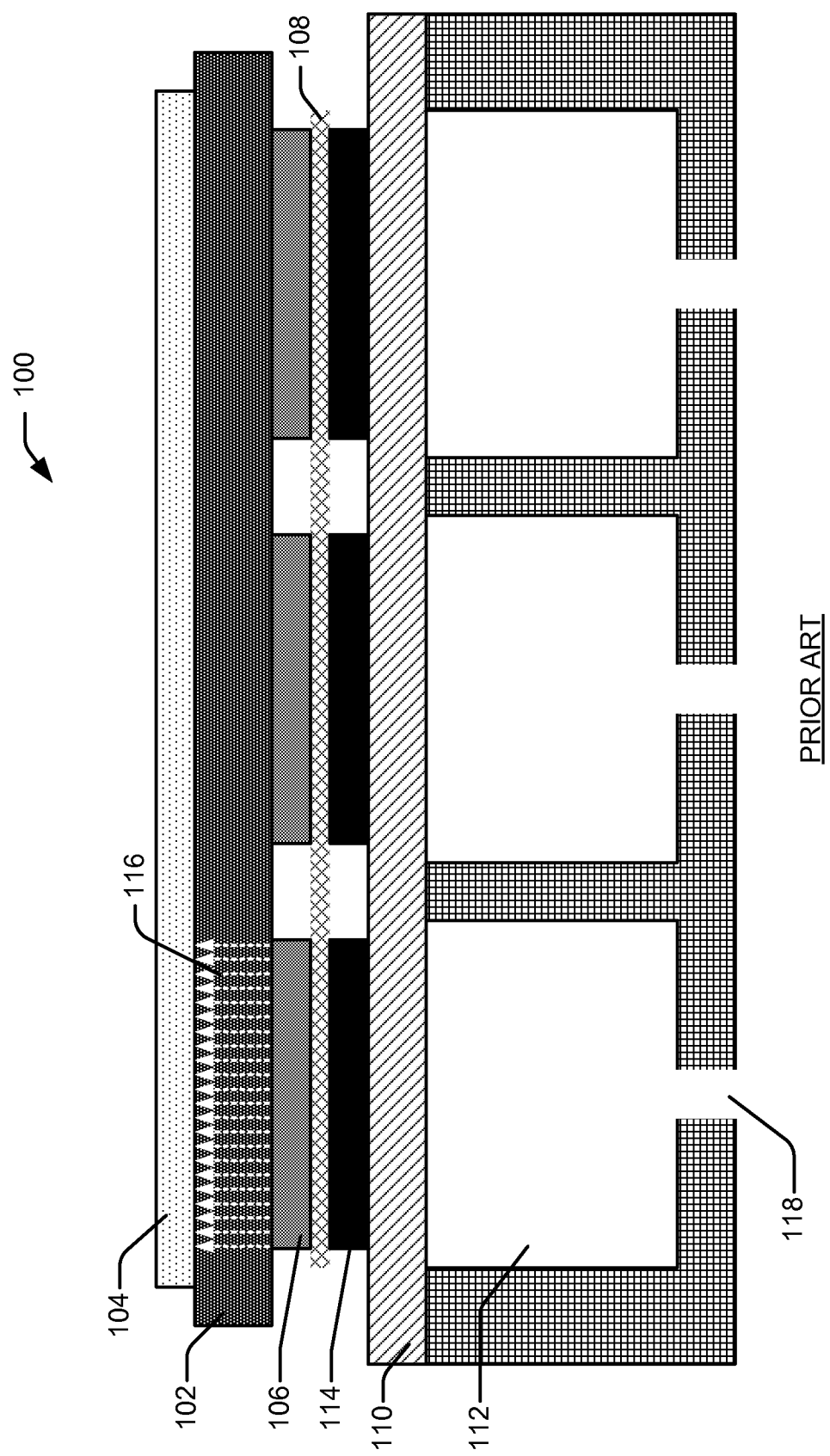

As noted above, one problem with prior methods of constructing an array of piezoelectric actuators in a piezoelectric inkjet printhead is the difficulty in precisely aligning the piezoceramic plate relative to the diaphragm and corresponding pressure chambers. Misalignment of the piezoceramic plate can result in reduced performance of the printhead when the individual electrodes on the piezoceramic plate are out of alignment with respective diaphragm conductors and pressure chambers. FIGS. 1A-E show a partial array of piezoceramic actuators in a piezoelectric inkjet printhead 100 formed over a corresponding partial array of pressure chambers according to the prior art. In FIG. 1A, a partial array of piezoceramic actuators fabricated over corresponding pressure chambers in a piezoelectric inkjet printhead 100 is shown in a top down view. FIG. 1B shows a side view of the same partial array of piezoceramic actuators in the printhead 100.

Referring to FIGS. 1A and 1B, the piezoelectric inkjet printhead 100 includes a plate or sheet of piezoceramic material 102 (e.g., a PZT plate—lead zirconate titanate). The piezoceramic plate 102 includes a common electrode 104 formed on a top surface and separate or individual electrodes 106 that are not electrically connected to one another formed on a bottom surface. In some applications the surfaces on which the common electrode 104 and the individual electrodes 106 are formed may be reversed. The piezoceramic plate 102 is bonded by a conductive anisotropic adhesive 108 to a diaphragm 110 covering pressure chambers 112. The diaphragm 110 has conductors 114 formed on its top surface over each pressure chamber 112. The individual electrodes 106 on piezoceramic plate 102 and the conductors 114 are in the shape of the chambers 112 (e.g., circular, as shown in this example), and when the plate 102 is bonded to the diaphragm 110, the electrodes 106, conductors 114, and chambers 112 should be in alignment as shown in FIGS. 1A and 1B. In operation, an electric field 116 in the volume between a particular electrode 106 and the common electrode 104 is generated by applying a voltage at a particular diaphragm conductor 114 corresponding to the particular electrode 106. The electric field 116 generated in the piezoceramic plate 102 causes the piezoceramic plate 102 to deform in the area of the electric field 116. The deformation causes the diaphragm 110 to bend toward the ink chamber 112, which in turn compresses liquid ink within the associated pressure chamber 112, forcing a drop of ink out of a corresponding nozzle 118.

Figure 1C:
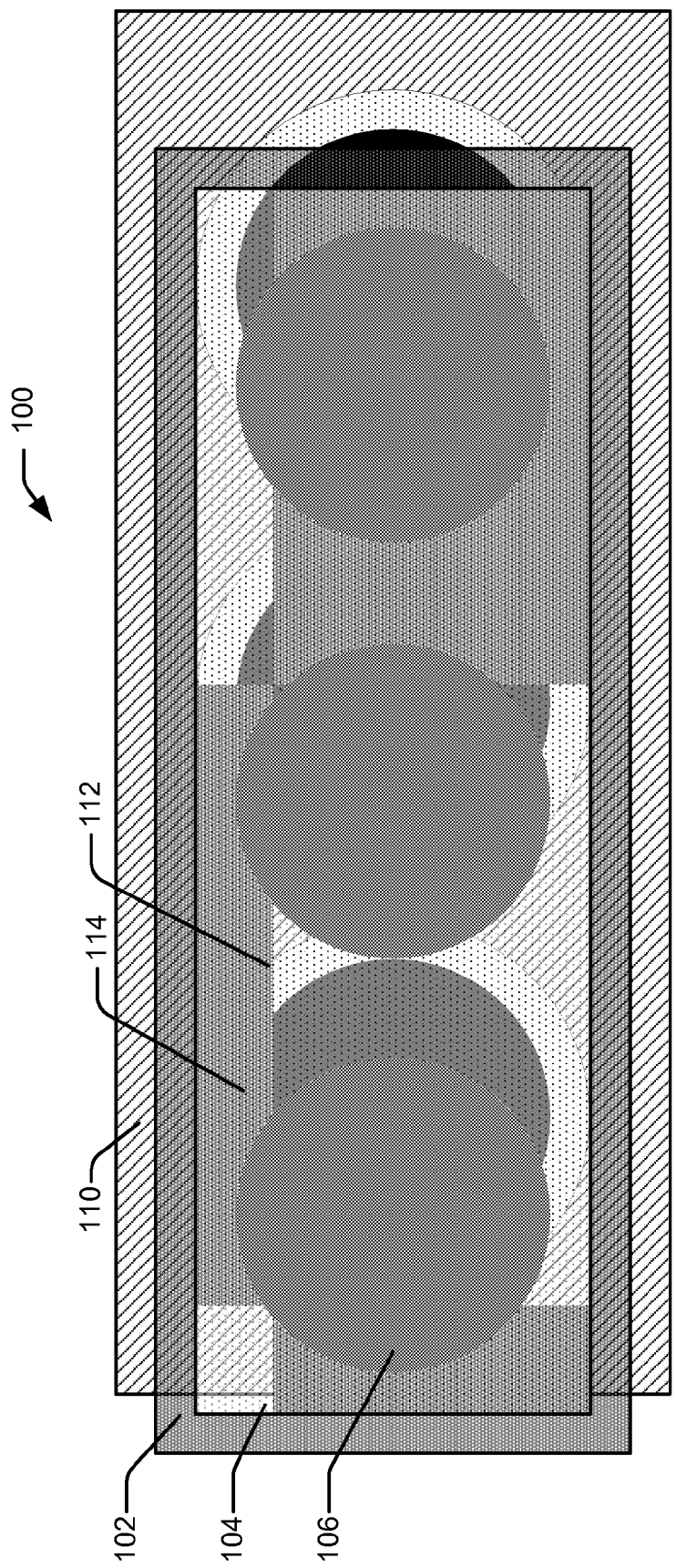
Figure 1D:
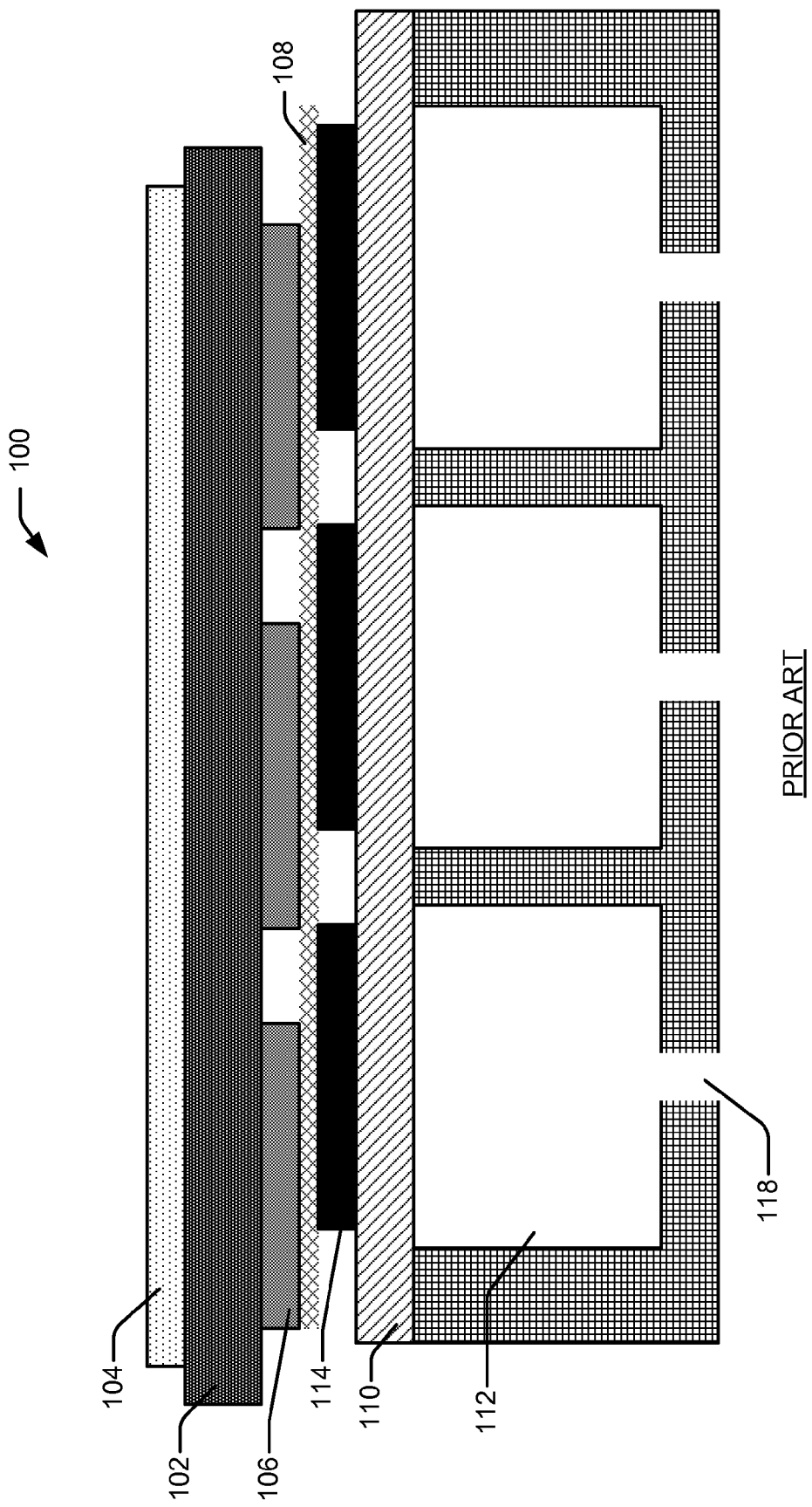
Figure 1E:
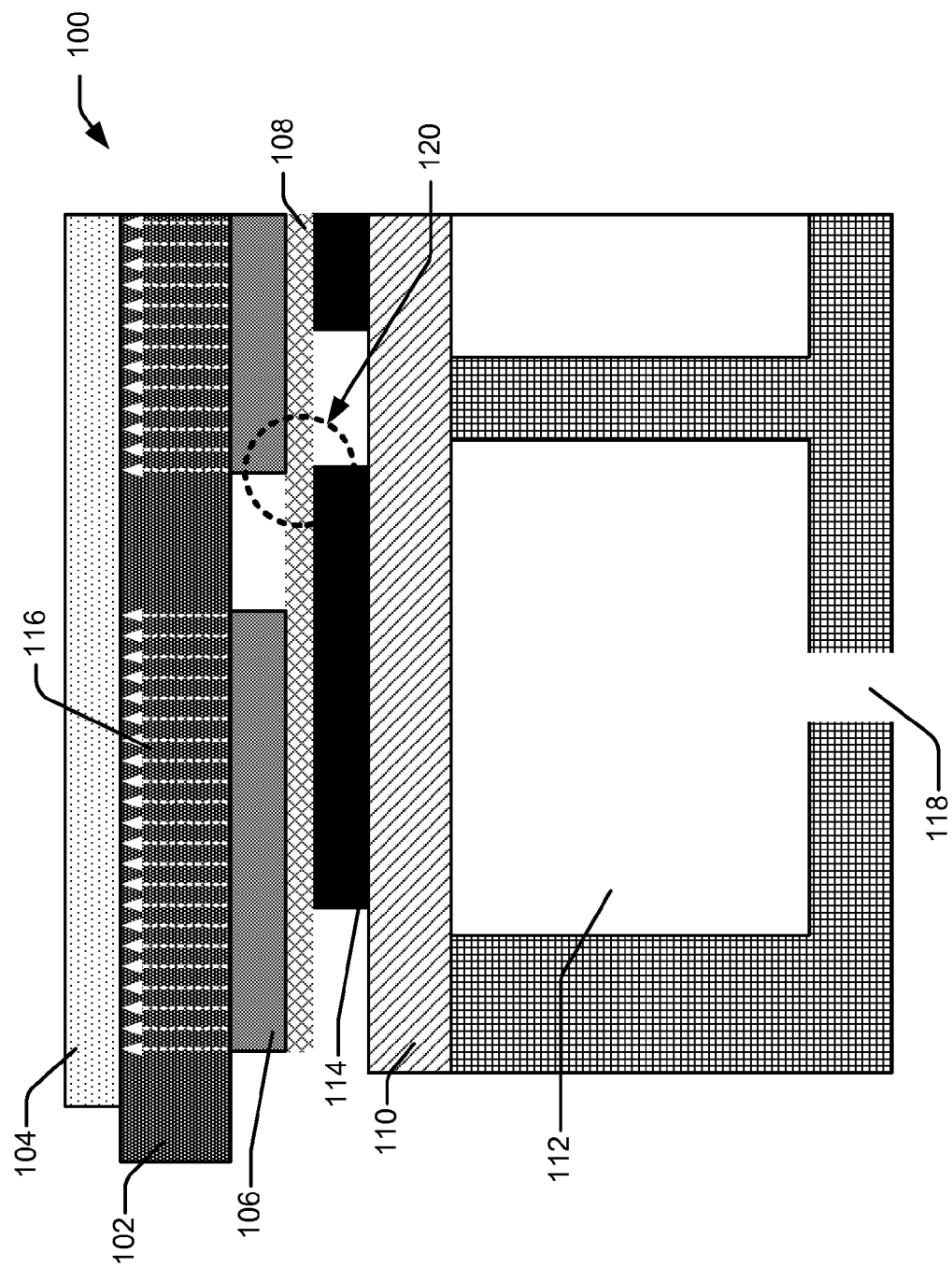

The performance of the piezoelectric inkjet printhead 100 can be adversely affected, however, if the piezoceramic plate 102 is misaligned relative to the diaphragm 110 and pressure chambers 112. When the piezoceramic plate 102 and diaphragm 110 are not properly aligned, there is a corresponding misalignment between the plate electrodes 106, diaphragm conductors 114 and pressure chambers 112. FIGS. 1C-1E show the piezoceramic plate 102 in misalignment relative to the diaphragm 110 and pressure chambers 112 within piezoelectric inkjet printhead 100. As is apparent from FIGS. 1C and 1D, the result of the misaligned piezoceramic plate 102 is that the electrodes 106 no longer line up directly over the pressure chambers 112 and diaphragm conductors 114. As FIG. 1E further illustrates, this misalignment results in a shift in the location of the electric field 116 applied to the piezoceramic plate 102 with respect to the pressure chambers 112. Thus, the deformation in the piezoceramic plate 102 caused by the shifted electric field 116 is not aligned (i.e., is not concentric in this case) with respect to the pressure chamber 112. Because the plate 102 is not aligned over the pressure chamber 112, the resulting displacement of the diaphragm is smaller and less ink is forced out through the corresponding nozzle 118. In the case where the misalignment is severe (e.g., the electrode is over the wall between the chambers), the displacement of the diaphragm is reduced sufficiently that no drop is emitted. In addition, as shown by the region within the dashed circle 120 of FIG. 1E, highly misaligned electrodes 106 create the possibility of a short circuit between electrodes of neighboring pressure chambers 112, which can cause the inadvertent expulsion of ink drops through an unintended, neighboring nozzle 118.

Embodiments of the present disclosure overcome the problems associated with misalignment of the piezoceramic plate relative to the diaphragm and pressure chambers through the use of electrode segments. The embodiments allow for extending the piezoceramic plate over multiple pressure chambers without electrical interference between adjacent chambers. Electrode segments enable a more arbitrary positioning of the piezoceramic plate over the diaphragm because alignment of the plate relative to the diaphragm and pressure chambers is no longer as critical. The reduced need for extreme accuracy in aligning the piezoceramic plate helps to reduce fabrication costs.

In one embodiment, for example, a method of making an inkjet printhead includes depositing a first metallic electrode and a second metallic electrode over a top surface and a bottom surface, respectively, of a piezoceramic plate. The second metallic electrode is segmented into a plurality of disconnected and equally spaced electrode segments. A diaphragm is positioned over a plurality of pressure chambers, wherein the diaphragm includes a chamber-shaped conductor positioned over each chamber. The piezoceramic plate is attached to the diaphragm such that the conductors on the diaphragm face the electrode segments.

In another embodiment, a piezoelectric printhead includes an array of pressure chambers covered on a top side by a single diaphragm, with each chamber having a nozzle formed in its bottom side. A conductor is formed on the diaphragm over each chamber in the array. A piezoceramic plate has a first metallic electrode over a top surface and a second metallic electrode over a bottom surface, and the second metallic electrode is segmented into a plurality of disconnected and equally spaced electrode segments. The piezoceramic plate is attached to the diaphragm with the conductors facing the electrode segments.

In still another embodiment, a method of defining an active area of a piezoceramic sheet includes depositing a first electrode and second electrode over a top surface and bottom surface, respectively, of a piezoceramic sheet, and segmenting the second electrode into a plurality of discontinuous electrode segments. A diaphragm is positioned over a plurality of pressure chambers, with chamber-shaped conductors on the diaphragm positioned over each chamber. The piezoceramic sheet is attached to the diaphragm with the conductors facing the electrode segments such that active electrode segments align over each conductor, and active areas of the piezoceramic sheet are defined by electric fields between the active electrode segments and the first electrode when voltage is applied through each conductor.

Illustrative Embodiments

Figure 2:
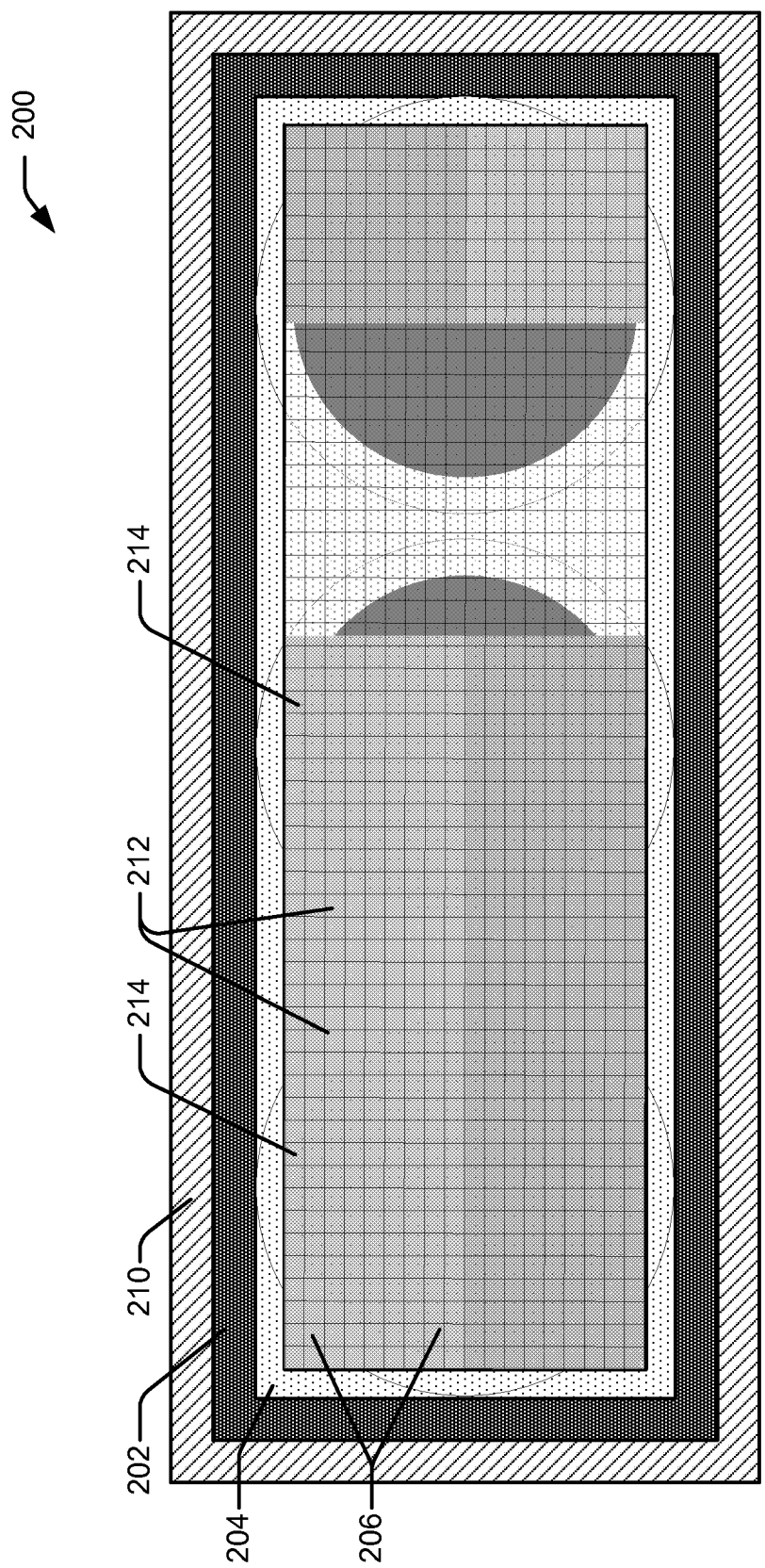
FIG. 2 shows a top down view of an example of a partial array of piezoceramic actuators in a piezoelectric inkjet printhead according to an embodiment.
Figure 3:
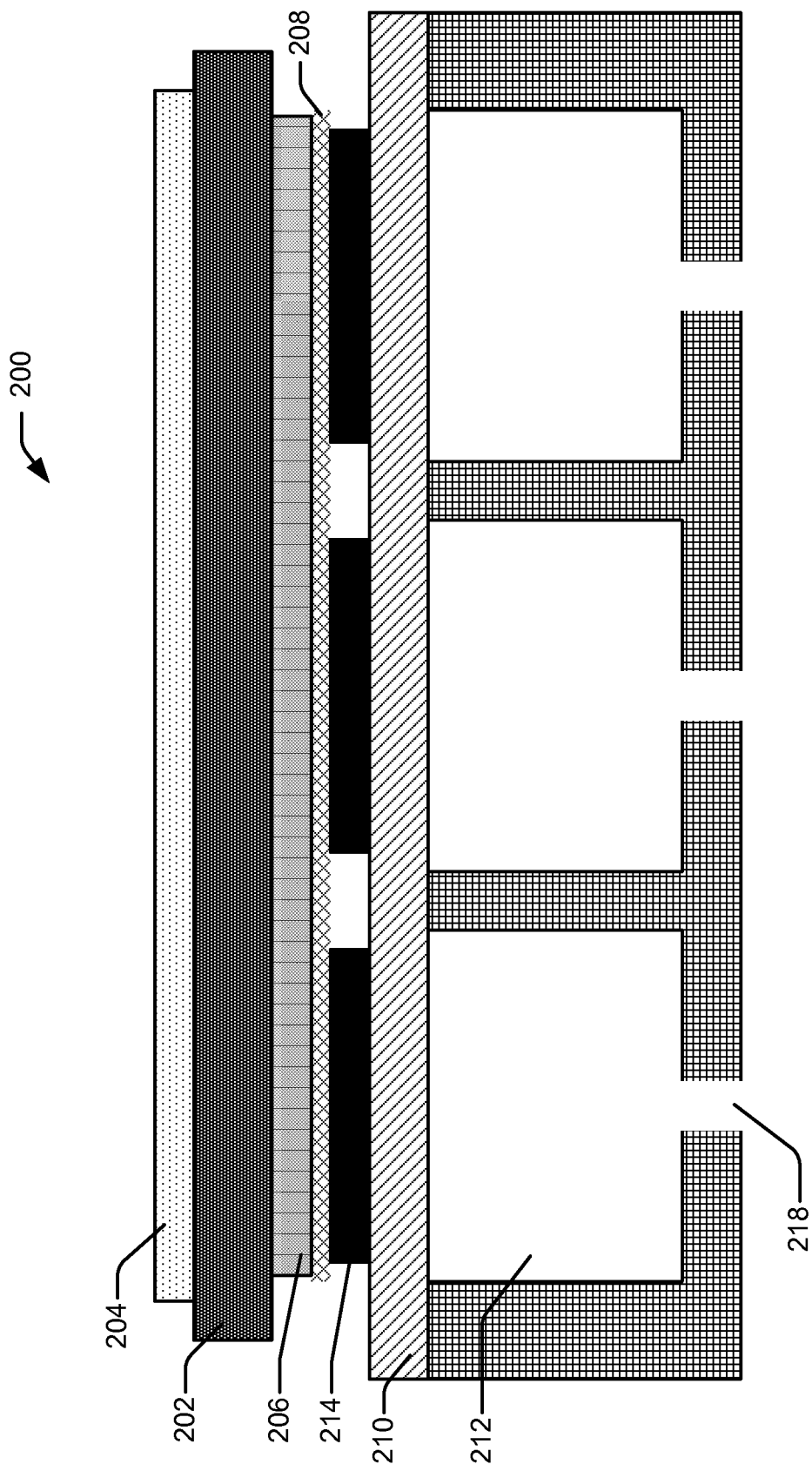
FIG. 3 shows a side view of an example of a partial array of piezoceramic actuators in a piezoelectric inkjet printhead according to an embodiment.

FIG. 2 shows a top down view of an example of a partial array of piezoceramic actuators in a piezoelectric inkjet printhead 200 formed over a corresponding partial array of pressure chambers according to an embodiment. FIG. 3 shows a side view of the same partial array of piezoceramic actuators in the printhead 200 according to an embodiment. The piezoelectric inkjet printhead 200 includes a plate or sheet of piezoceramic material 202 (e.g., a PZT plate—lead zirconate titanate). The piezoceramic plate 202 includes a common electrode 204 formed on a top surface and a plurality of electrode segments 206 formed on a bottom surface. The electrode segments 206 are physically and electrically disconnected from one another and they are equally spaced across the bottom surface of the piezoceramic plate 202. In some implementations the surfaces of the piezoceramic plate 202 on which the common electrode 204 and the electrode segments 206 are formed may be reversed.

The piezoceramic plate 202 is bonded by a conductive anisotropic adhesive 208 to a diaphragm 210 (e.g., a glass plate) affixed to and covering pressure chambers 212. The diaphragm 210 has conductors 214 formed on its top surface over each pressure chamber 212. The conductors 214 are in the shape of the footprint of chambers 212, which in this example is generally circular. That is, although chambers 212 may be of various shapes, they are cylindrical in this example, and conductors 214 have a circular shape to correspond with the top circular areas of the chambers 212 covered by diaphragm 210. When plate 202 is bonded to diaphragm 210, conductors 214 and chambers 212 should be in alignment, and the conductors 214 will be facing the electrode segments 206 formed on the bottom surface of the piezoceramic plate 202 as shown in FIGS. 2 and 3.

Unlike the prior art examples such as those discussed above with respect to FIG. 1, in the present embodiment shown in FIGS. 2 and 3 there are no individual electrodes on the piezoceramic plate 202 intended to align on a one-to-one basis with corresponding chambers 212 and conductors 214. Instead, as discussed in greater detail below, the plurality of electrode segments 206 covers the entire bottom surface of the piezoceramic plate 202, and the electrode segments 206 do not align on a one-to-one basis with corresponding chambers 212 and conductors 214. Rather, by virtue of the many electrode segments 206 covering the bottom surface of the piezoceramic plate 202, for a given piezoceramic actuator within a piezoelectric inkjet printhead 200, the electrode segments 206 may be viewed as aligning with chambers 212 and conductors 214 on a many-to-one basis depending on which of the electrode segments 206 happen to align with particular conductors 214 when the piezoceramic plate 202 is bonded to the diaphragm 210. Thus, a given piezoceramic actuator within piezoelectric inkjet printhead 200 for a particular pressure chamber 212 may be said to include diaphragm 210 (or a corresponding part thereof), a corresponding conductor 214 on diaphragm 210, the piezoceramic plate 202 (or a corresponding part thereof), common electrode 204, and only those electrode segments 206 (i.e., active electrode segments) that align with and/or fall, fully or partially, within the circular footprint of the corresponding conductor 214.

Figure 4:
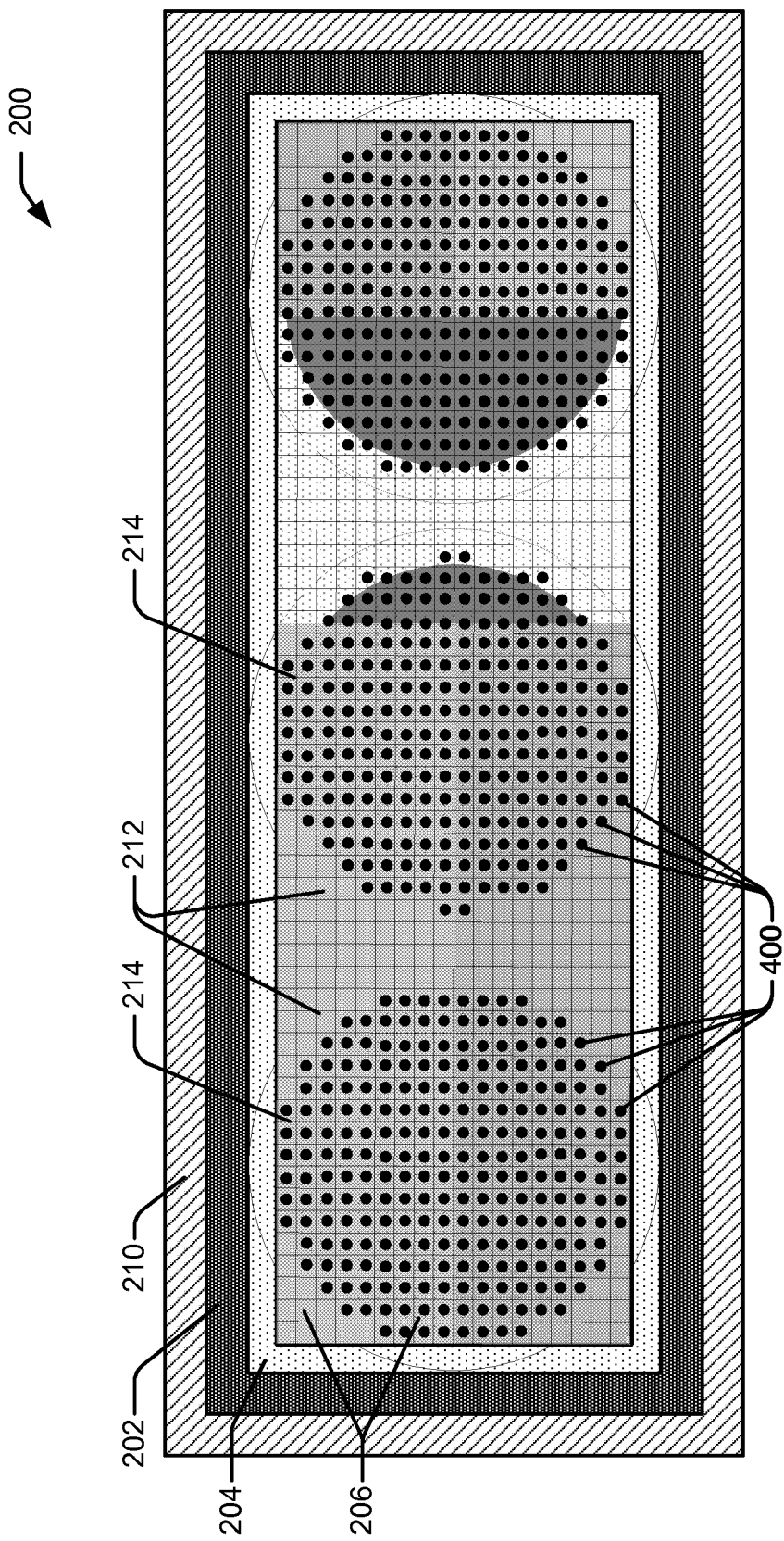
FIG. 4 shows a top down view of an example of active electrode segments in a partial array of piezoceramic actuators in a piezoelectric inkjet printhead according to an embodiment.
Figure 5:
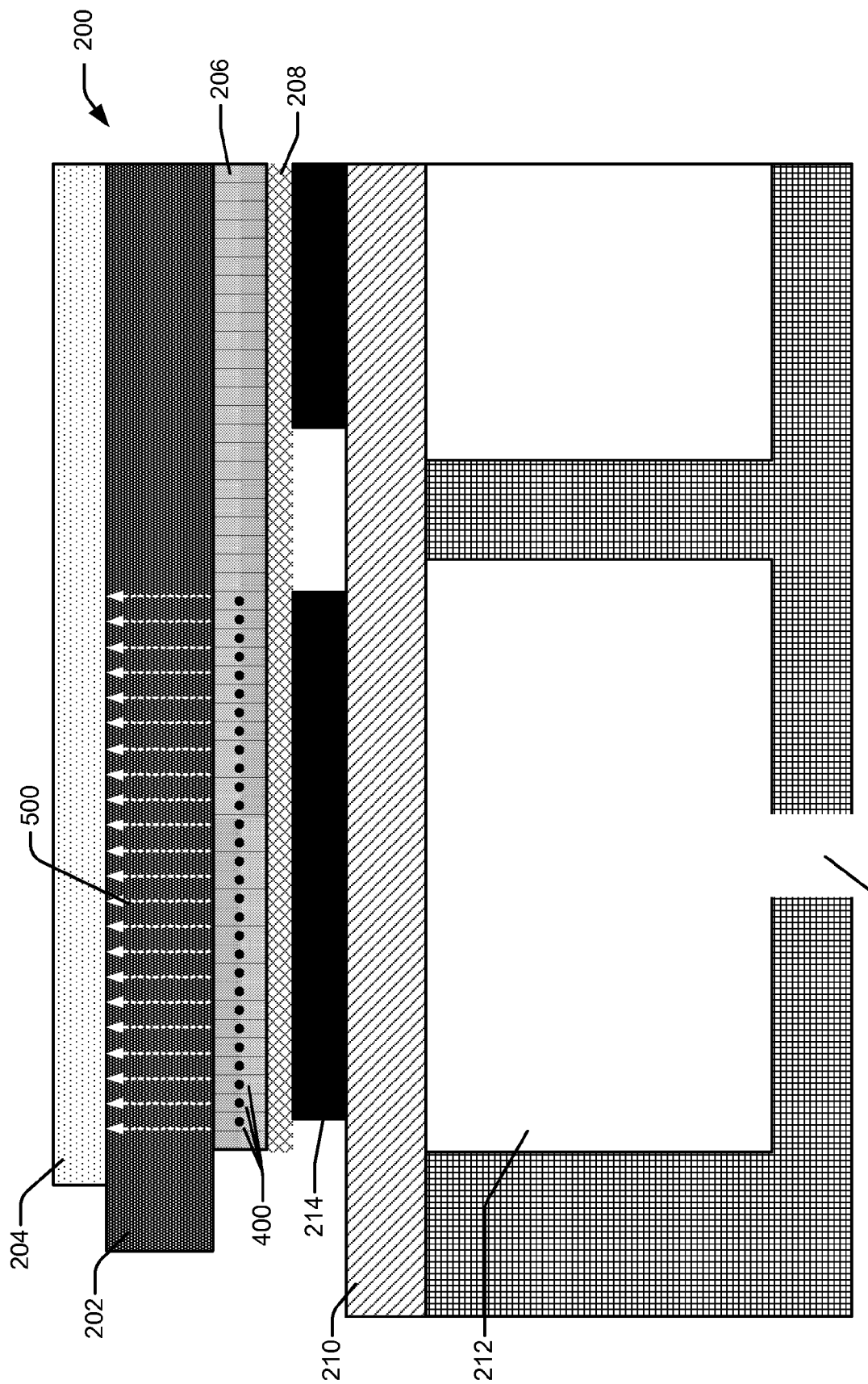
FIG. 5 shows a side view of an example of active electrode segments in a partial array of piezoceramic actuators in a piezoelectric inkjet printhead according to an embodiment.

Referring to FIGS. 4 and 5, the electrode segments 206 that can be active as part of a piezoceramic actuator within piezoelectric inkjet printhead 200 have been marked with dots at their centers (i.e., active electrode segments 400). As is apparent from FIG. 4, electrode segments 206 that can be active electrode segments 400 are those segments 206 that align fully or partly with the circular footprint of a corresponding conductor 214 (i.e., those electrode segments 206 marked with dots in FIGS. 4 and 5 are active electrode segments 400). Electrode segments 206 that do not align fully or partly within the circular footprint of a corresponding conductor 214 will not be active segments (i.e., those electrode segments 206 without dots in FIGS. 4 and 5 are not active electrode segments 400).

In operation, ink is forced out the nozzle 218 of a particular chamber 212 when a voltage is applied to a diaphragm conductor 214 which corresponds to the particular chamber 212. Voltage applied to a diaphragm conductor 214 results in a corresponding voltage at each of the active electrode segments 400 through the conductive anisotropic adhesive 208, or, for example, through direct contact with solder or ultrasonic diffusion bonding, or through direct contact between the diaphragm conductor and the electrode segments by using a non-conductive adhesive if the bond line is thin enough to allow surface roughness of the metal on the segmented electrodes to touch the metal on the diaphragm conductors. As is apparent from FIG. 5, the application of a voltage to the active electrode segments 400 creates or generates an electric field 500 through the piezoceramic plate 202 between the active electrode segments 400 and the common electrode 204. The electric field 500 generated in the piezoceramic plate 202 causes the piezoceramic plate 202 to deform in the area of the electric field 500. The deformation (e.g., contraction) of the piezoceramic plate 202 in the plane parallel to the diaphragm causes the diaphragm 210 to bend, compressing liquid ink within the associated pressure chamber 212 and forcing a drop of ink out of a corresponding nozzle 218.

Figure 6:
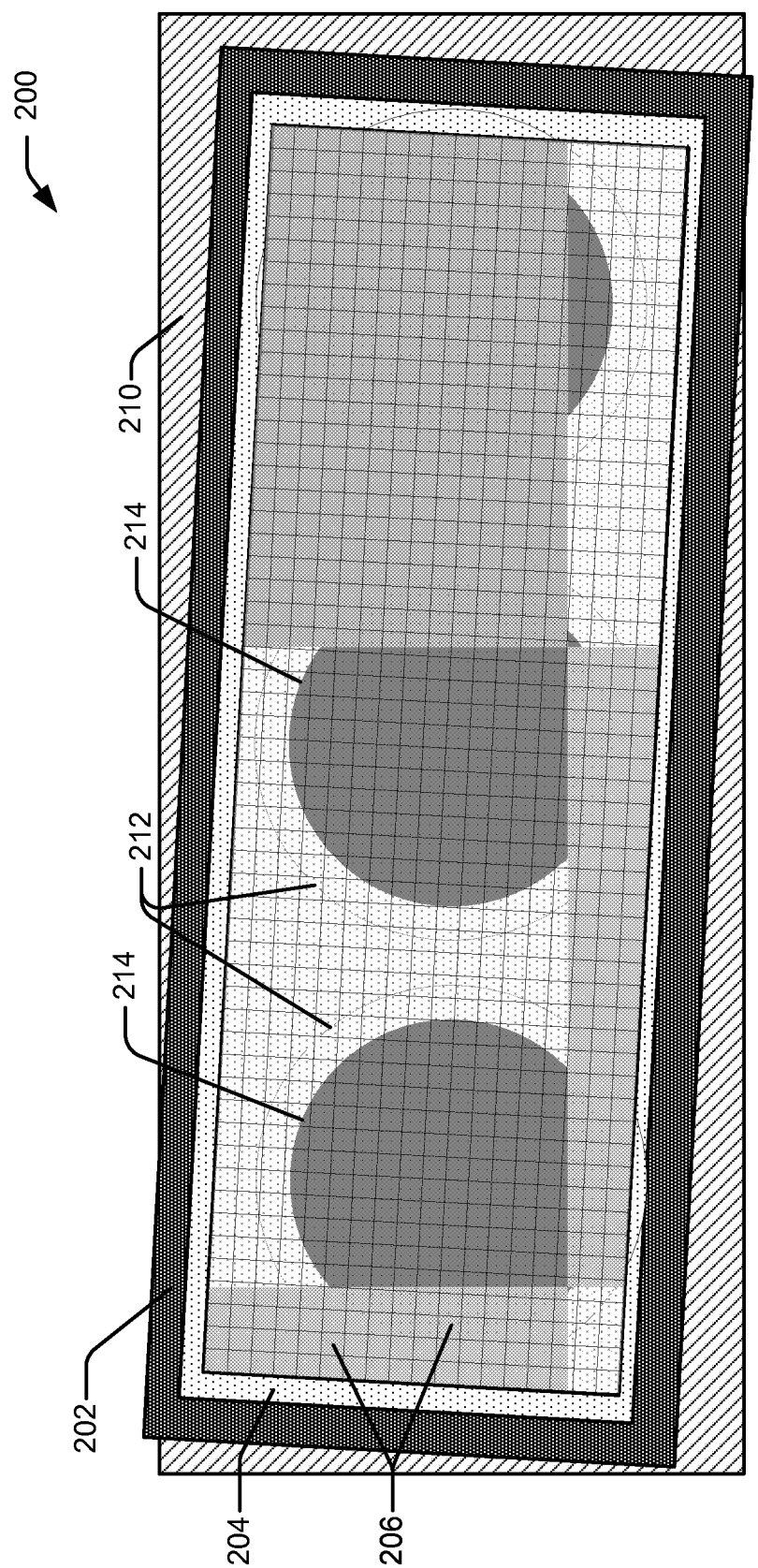
FIG. 6 shows an example of a piezoceramic plate that is misaligned relative to a diaphragm and pressure chambers according to an embodiment.
Figure 7:
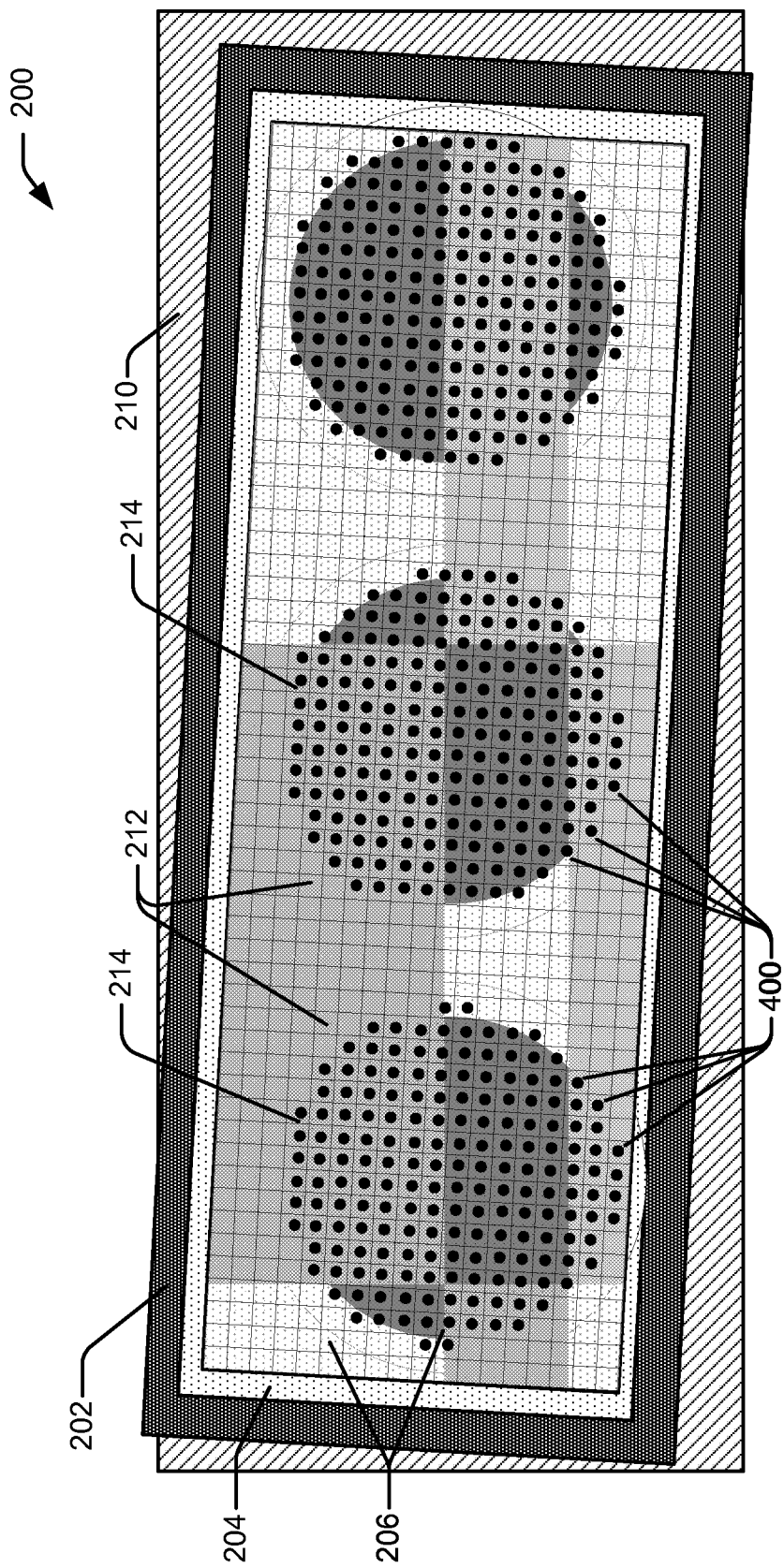
FIG. 7 shows an example of active electrode segments in a piezoceramic plate that is misaligned relative to a diaphragm and pressure chambers according to an embodiment.
Figure 8:
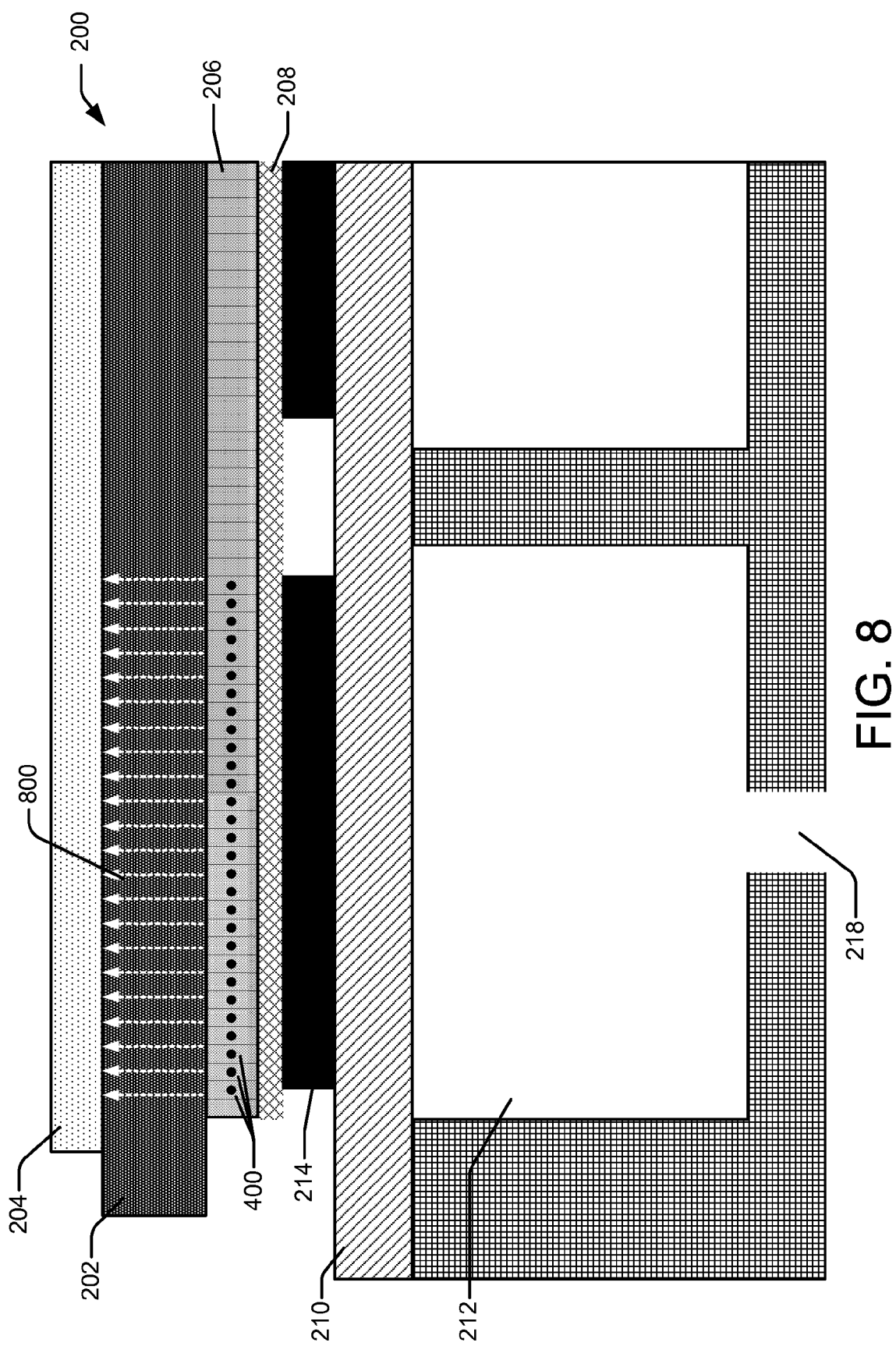
FIG. 8 shows a side view of an example of active electrode segments in a piezoceramic plate that is misaligned relative to a diaphragm and pressure chambers according to an embodiment.

As mentioned briefly above, the electrode segments 206 discussed with respect to embodiments of the present disclosure overcome problems associated with misalignment of the piezoceramic plate 202 relative to the diaphragm 210 and pressure chambers 212. The electrode segments 206 allow for extending the piezoceramic plate 202 over multiple pressure chambers 212 without electrical interference between adjacent chambers. Electrode segments 206 also enable a more arbitrary positioning of the piezoceramic plate 202 with respect to the diaphragm 210 because alignment of the plate relative to the diaphragm and pressure chambers is no longer as critical. FIG. 6 shows an example of a piezoceramic plate 202 that is misaligned relative to the diaphragm 210 and pressure chambers 212. FIG. 7 shows the same example of the misaligned piezoceramic plate 202 from FIG. 6, except that active electrode segments 400 are again illustrated with dots at their centers. FIG. 8 shows a portion of FIG. 7 from a side view, again illustrating the active electrode segments 400 with dots at their centers.

From FIGS. 7 and 8, it is apparent from the active electrode segments 400 that even with the misalignment of the piezoceramic plate 202 relative to the diaphragm 210 and pressure chambers 212, an electric field 800 generated through the piezoceramic plate 202 between the active electrode segments 400 and the common electrode 204 is still correctly aligned over the corresponding chamber 212. This is so because electrode segments 206 become active electrode segments 400 by virtue of their alignment within the footprint of the diaphragm conductor 214 when the piezoceramic plate 202 is bonded to the diaphragm 210. Because electrode segments 206 are active electrode segments 400 only when they align with or fall within the footprint of the diaphragm conductor 214, it is the diaphragm conductor 214 that controls or dictates the location of the electric field 800 in the piezoceramic plate 202. A misalignment of the piezoceramic plate 202 relative to the diaphragm 210 does not cause any corresponding misalignment of the electrode segments 206 that would impact the location of the electric field 800.

Figure 9:
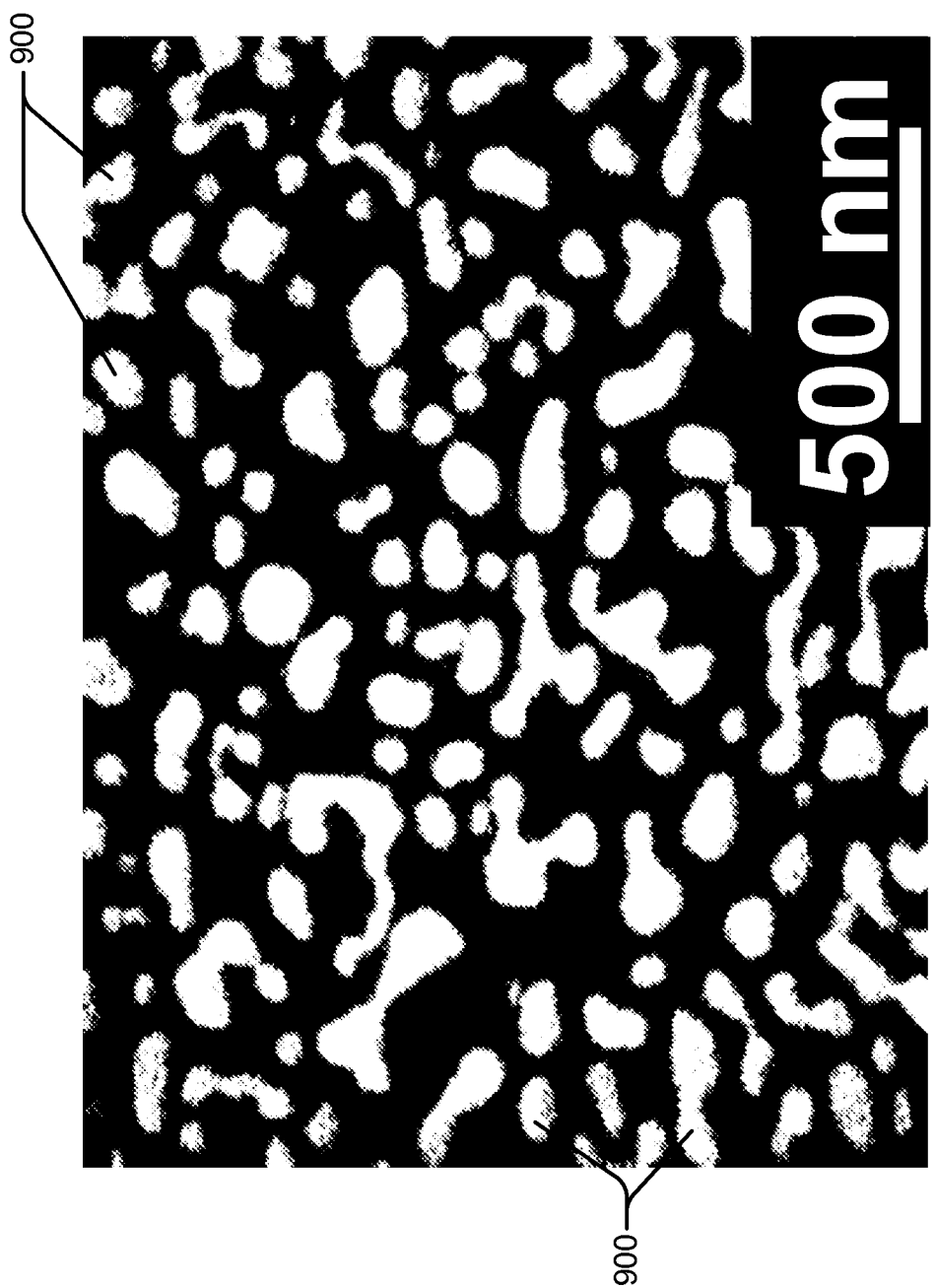
FIGS. 9 and 10 show irregular electrode segments of discontinuous metal islands according to an embodiment.
Figure 10:
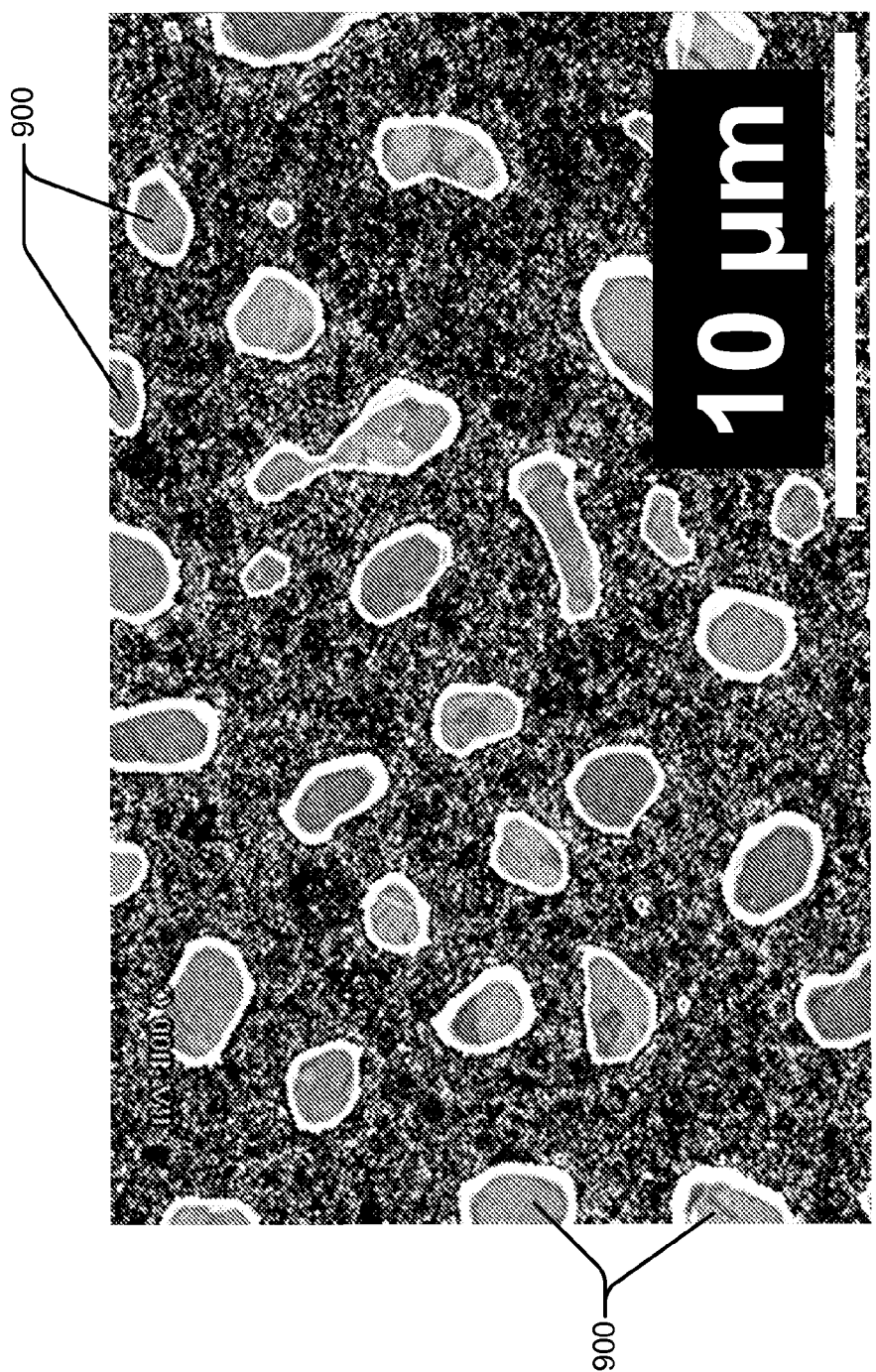

In general, the piezoelectric printhead 200 with piezoceramic actuators as previously discussed is fabricated using well-known process steps commonly employed in manufacturing printed circuit boards. A piezoceramic plate 202 (25 mm×10 mm), for example, is lapped smooth to a thickness of 50 microns. A metallic electrode (e.g., chromium, nickel, & gold layers) is deposited (e.g., sputter deposited or evaporated) uniformly over both the top and bottom surfaces to a thickness of 0.5 microns. The electrode on one surface (e.g., the bottom surface) of the plate 202 is etched through patterned openings in a resist layer formed by photolithography. In one embodiment, the metal electrode is chosen for its affinity to coalesce into islands upon heating, and it segregates into discontinuous metal islands in a heating or annealing process. After etching (or heating/annealing) the remaining metal (or metal islands) forms a grid of regular electrode segments 206, in case of patterning and etching, having shapes such as triangles, squares, hexagons, and rectangles, that are equally spaced (tessellated) and that fully cover the surface, or irregular electrode segments 900 in case of discontinuous metal islands such as those shown in FIGS. 9 and 10. The piezoceramic plate 202 is attached to the surface of a non-conducting diaphragm 210 that overlays rows of pressure chambers 212 with the electrode segments 206 facing the diaphragm 210. On the surface of the diaphragm 210, in the interface between the piezoceramic plate 202 and the non-conducting diaphragm 210, is a thin metal conducting layer (e.g., 0.5 microns) in a circular shape that corresponds with the footprint of the cylindrical pressure chamber 212. The metal conductor 214 is centered on the chamber 212 in at least one axis. Electrical conductance is established with each electrode segment 206 that has a portion of or all of its area opposite the chamber conductor 214. Conductance can be created with an anisotropic adhesive or through direct contact with solder or ultrasonic diffusion bonding or non-conductive, thin, bond-line adhesive.

Figure 11:
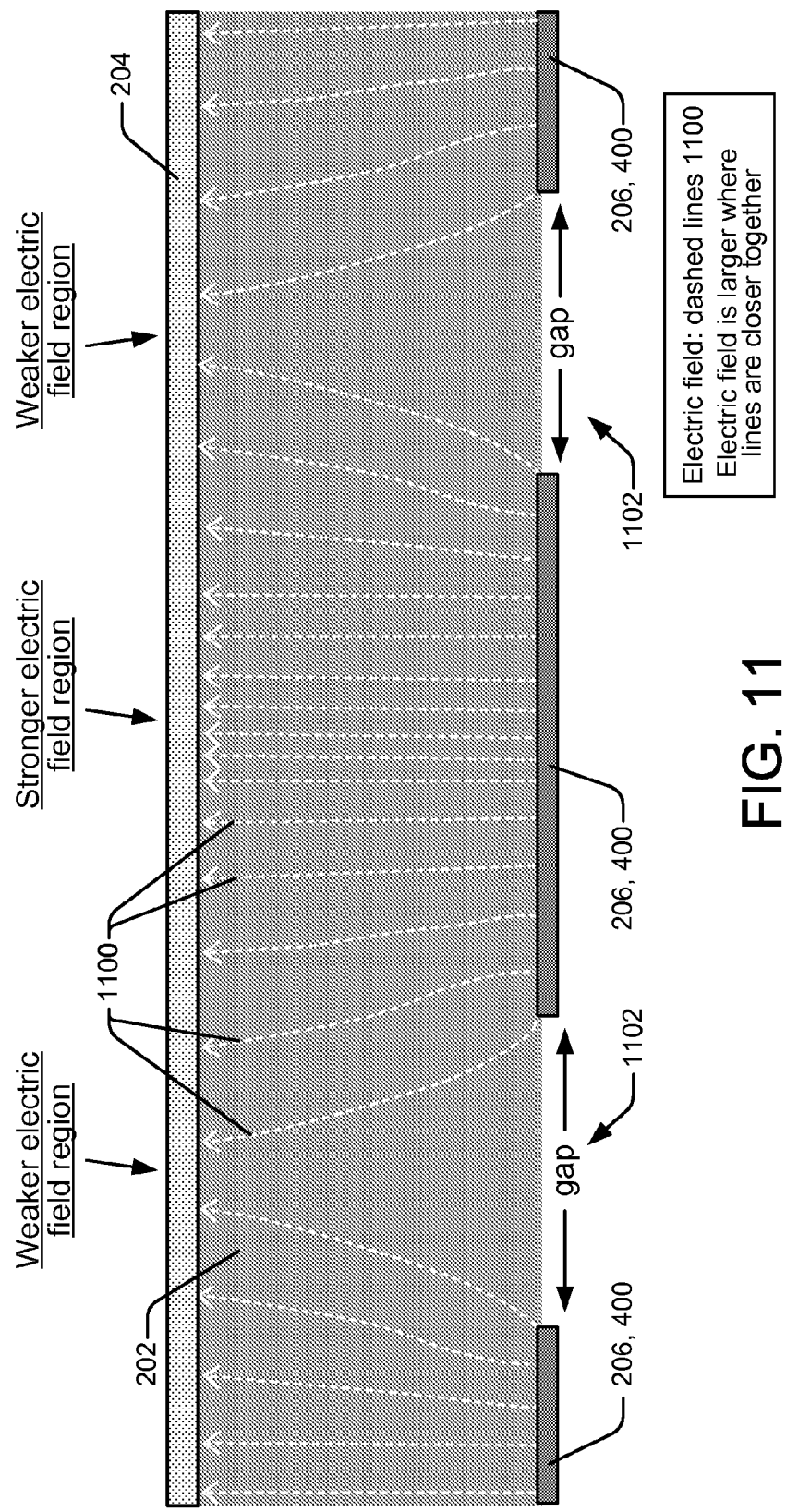
FIG. 11 shows an example of a cross-section of a piezoceramic plate, illustrating a reduced and non-uniform electric field according to an embodiment.

The electric field (e.g., electric field 500, FIG. 5) in the piezoceramic plate 202 should be uniform and as large as the piezoceramic can tolerate without undue degradation. Segmenting the initial single electrode into electrode segments 206 introduces regions of reduced electric field both in the gaps between the electrode segments 206 and beneath the electrode segments 206 near their edges. FIG. 11 shows a cross-section of the piezoceramic plate 202 with the common electrode 204 on its top surface and the electrode segments 206 (400) on its bottom surface, illustrating a reduced and non-uniform electric field 1100 between the common electrode 204 and electrode segments 206 (400) in and near the gaps 1102 between the electrode segments 206 (400), according to an embodiment.

When an anisotropic adhesive is used, contact is made by randomly dispersed metal coated spheres, the size of electrode segments 206 should be as large as possible to ensure good electrical connection, that is, at least one sphere contacts each segment. The size of the electrode segments 206 is limited by the need to have an active region which covers most of the area above the conductor 214 and which does not extend significantly over the regions outside the conductor 214. This ragged region should not extend beyond the walls of the chamber where the possibility of shorting increases. Assuming the spheres do not aggregate, the electrode segment size should be increased up to the raggedness limit. In one example, the electrode segments 206 should be at least 10× smaller than the smallest dimension of the active region in the piezoceramic plate. The active region of the piezoceramic plate is dictated or controlled by the dimensions of the diaphragm conductor 214. Thus, for a square conductor centered over a square chamber with a side having a 250 micron dimension, the conductor 214 might have a side dimension of 200 microns. The electrode segment could be 10-20 microns with a 1-2 micron gap 1102.

The size of the gap relative to the size of the electrode segments 206 depends on the bonding process. If an anisotropic adhesive with conductive spheres is used, then the gap should be large enough that spheres do not bridge between segments well outside the conductor 214. Typical conductive spheres have a diameter in the range of 3-5 microns which would easily bridge gaps up to 4 microns. As a result, spheres 1-2 microns in diameter would be needed. A 2 micron sphere won't bridge a 1 micron gap that is <0.6 micron deep. If there is a range of sizes around a mean of 2 micron or several spheres that agglomerate, the gap could be bridged. Thus, the gap could be experimentally adjusted to match the actual shapes and sizes of the conductive spheres. However, the gap need not be increased for the occasional two or three ball agglomeration, since this would only activate segments adjacent to the desired active area and still away from the wall of the chamber. The practical limit for etch processes is set by the resist thickness, mask type used, thickness of the electrode, smoothness of the piezoceramic, type of etch process (wet vs dry), and other etch related factors. One micron is an example of a lower limit for etch processes.

If the gaps 1102 are small primarily with respect to the dimensions of the electrode segment 206 (400) and secondarily with respect to the thickness of the piezoceramic plate 202, then the electric field 1100 under the center of each segment 206 (400) is at its maximum value and its uniformity is minimally affected by the presence of the gaps 1102. The field is reduced somewhat since the overall capacitance (stored charge) is proportional to the area of the electrodes. In this case, the applied voltage can be increased to boost the electric field. However, the electric field in the gap regions will not reach the same level it would if there were no gaps. In cases where the electrode segments cannot be made much larger than the gap (such as with nanoposts) or where the gap must be increased (such as with non-spherical conductive spheres or non-uniform sphere distribution), then the non-uniformity of the electric field at least beneath the electrodes is reduced. If the electrode area and the gap area are similar, then the electric field which escapes from between the electrode segment and the electrode will be similar. For square electrode segments (with rounded corners) this occurs when the segment side dimension is approximately 2.5× the gap dimension and the piezoceramic material thickness is much larger (>5×) than the electrode segments' dimensions.

If the non-active electrode segments 206 are removed in the case when the piezoceramic is removed down to the diaphragm, then the ragged boundary of the activated regions will change since some of the electrode segments around the perimeter of the conductor will no longer be whole and in contact with the conductor. The process for removing piezoceramic will likely leave a small amount of piezoceramic, as well as the electrode segments 206. In this case in the regions near the edge where the electrode segments 206 extend under the thinner piezoceramic, the raggedness will be unchanged.

Figure 12:
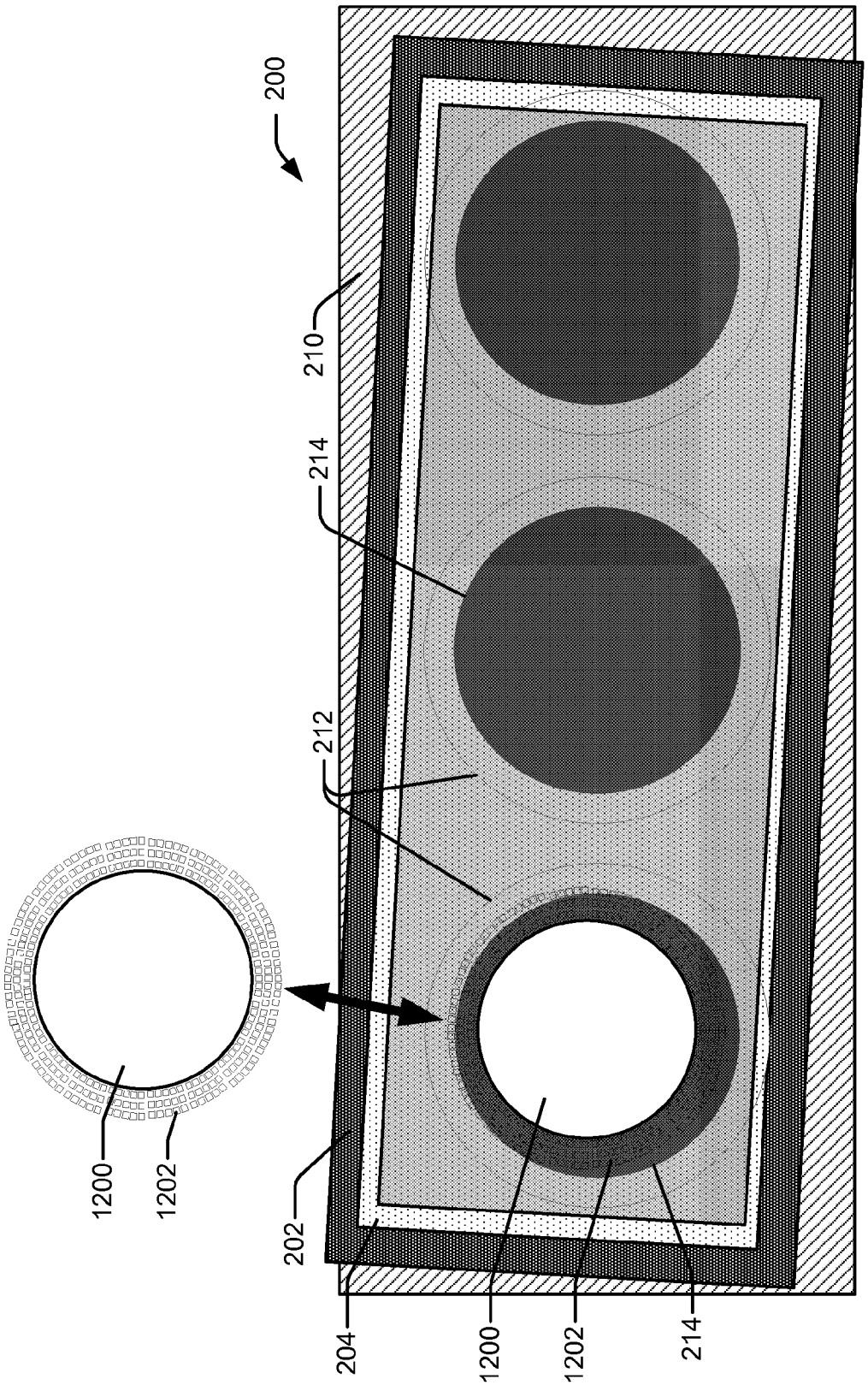
FIG. 12 shows a top down view of an example of a partial array of piezoceramic actuators in a piezoelectric inkjet printhead where electrode segments include a center electrode surrounded by one or more rings of additional electrode segments according to an embodiment.

In another embodiment, as shown in FIG. 12, electrode segments can include a first, center electrode 1200 that substantially covers the conductor 214 (e.g., with about 80% coverage or overlap), surrounded by one or more rings of additional electrode segments 1202. The rings of electrode segments 1202 surround the inner large segment 1200 in multiple concentric circles. The number of concentric circles of electrode segments is set by the expected maximum misalignment. In this instance, the center electrode 1200 is enough smaller than the conductor 214 that it fully overlaps with the conductor at maximum misalignment. The success of this embodiment is dependent on whether the accuracy of the positioning of the piezoceramic plate is sufficient for locating a single, center electrode which mostly covers the conductor 214.

Figure 13:
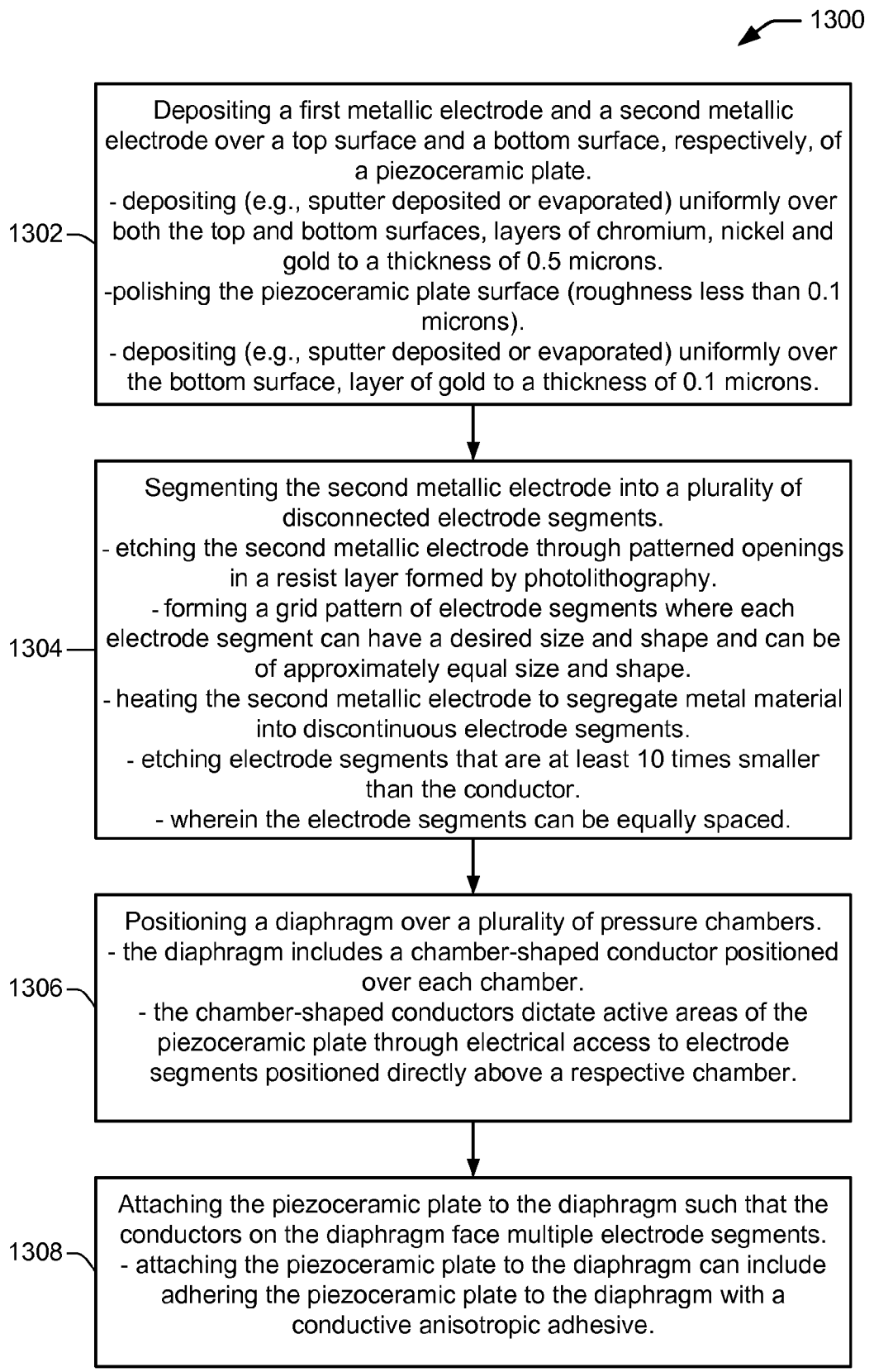
FIG. 13 shows a flowchart of a method of making an inkjet printhead according to an embodiment.

FIG. 13 shows a flowchart of a method 1300 of making an inkjet printhead according to an embodiment. Method 1300 is generally associated with embodiments discussed above with reference to FIGS. 2-12. Method 1300 begins at block 1302 with depositing a first metallic electrode and a second metallic electrode over a top surface and a bottom surface, respectively, of a piezoceramic plate. The depositing can include, for example, sputter depositing or evaporating uniformly over both the top and bottom surfaces, layers of chromium, nickel and gold to a thickness of 0.5 microns. The depositing can also include, for example, polishing the piezoceramic plate surface (roughness less than 0.1 microns) and sputter depositing or evaporating uniformly over the bottom surface, layer of gold to a thickness of 0.1 microns.

Method 1300 continues at block 1304 with segmenting the second metallic electrode into a plurality of disconnected and equally spaced electrode segments. The segmenting can include etching the second metallic electrode through patterned openings in a resist layer formed by photolithography, and forming a grid pattern of electrode segments where each electrode segment is of equal size and shape. The etching can include etching electrode segments that are at least 10 times smaller than the conductor. The segmenting may also include heating the second metallic electrode to segregate the metal material into discontinuous electrode segments. As noted above with respect to FIGS. 9 and 10, in one embodiment the metal electrode is chosen for its affinity to coalesce into islands upon heating, which forms irregular electrode segments 900 of discontinuous metal islands such as those shown in FIGS. 9 and 10. A discontinuous film can be created through aggregation on a piezoceramic surface from metal that has limited wettability to the surface or reduced adhesion when the metal is mobile at higher temperatures. For aggregation, the metal atoms should have an affinity to the surface less than to themselves and have sufficient adhesion to the piezoceramic surface when at room temperature. Silver and platinum are alternatives for gold which agglomerate. Certain rules apply when heating metal films that dictate the dimensions of conductive islands that can be covered. For example, metals with lower melting temperatures have lower aggregation temperatures; thinner metal films have lower aggregation temperatures; thinner film results in smaller islands while thicker film results in bigger islands; thinner film results in higher density islands while thicker film results in lower density islands; and some metals aggregate uniformly in all directions (x-y-z), while some aggregate more in the x-y direction but not in the z direction.

At block 1306 of method 1300, a diaphragm is positioned over a plurality of pressure chambers. The diaphragm includes a chamber-shaped conductor positioned over each chamber. The chamber-shaped conductors dictate active areas of the piezoceramic plate through electrical access to electrode segments positioned directly above a respective chamber. At block 1308, the method continues with attaching the piezoceramic plate to the diaphragm such that the conductors on the diaphragm face the electrode segments. Attaching the piezoceramic plate to the diaphragm can include adhering the piezoceramic plate to the diaphragm with a conductive anisotropic adhesive.

Figure 14:
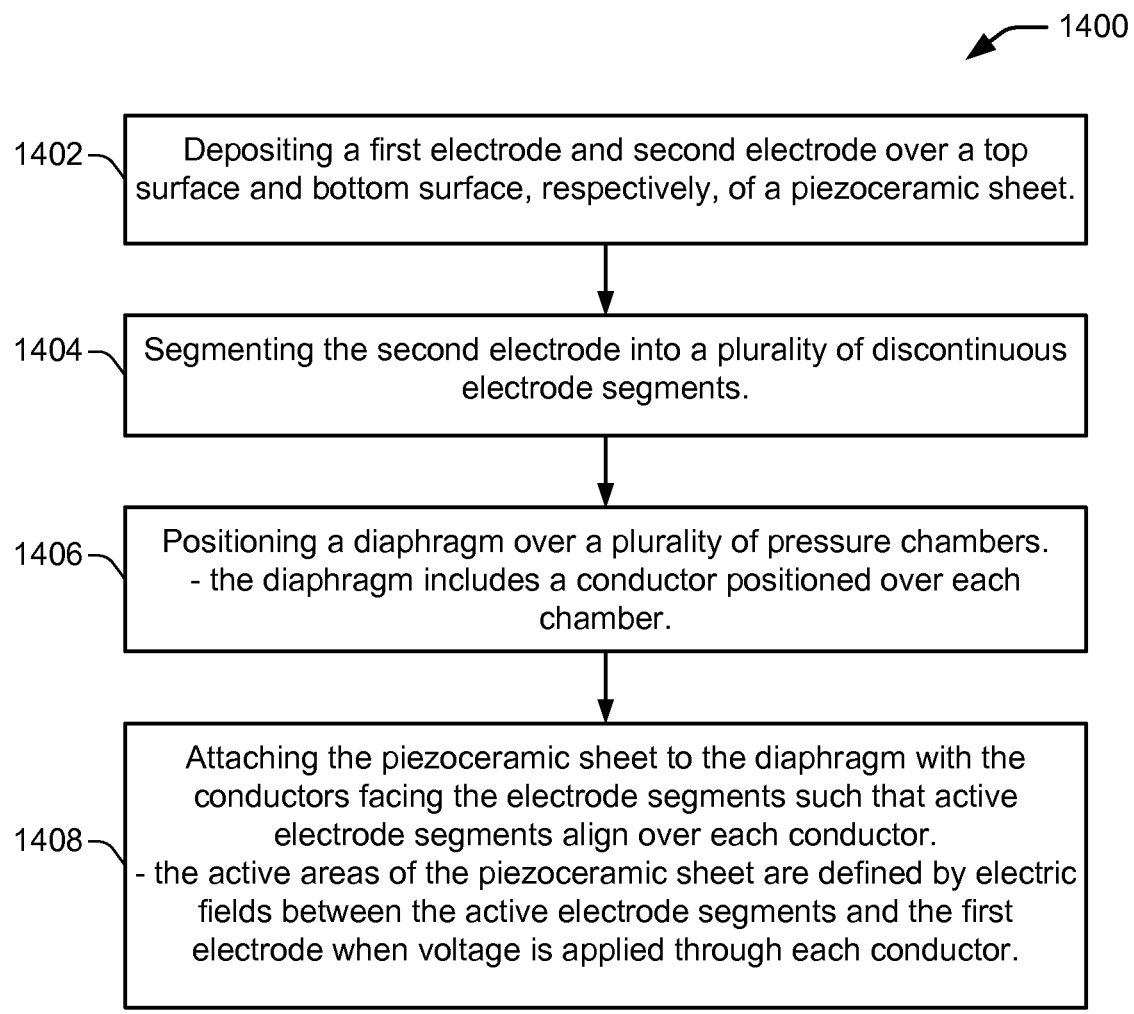
FIG. 14 shows a flowchart of a method of defining an active area of a piezoceramic sheet according to an embodiment.

FIG. 14 shows a flowchart of a method 1400 of defining an active area of a piezoceramic sheet according to an embodiment. Method 1400 is generally associated with embodiments discussed above with reference to FIGS. 2-12. Method 1400 begins at block 1402 with depositing a first electrode and second electrode over a top surface and bottom surface, respectively, of a piezoceramic sheet. Method 1400 continues at block 1404 with segmenting the second electrode into a plurality of discontinuous electrode segments. At block 1406, a diaphragm is positioned over a plurality of pressure chambers. The diaphragm includes a conductor positioned over each chamber. The method 1400 continues at block 1408 with attaching the piezoceramic sheet to the diaphragm with the conductors facing the electrode segments such that active electrode segments align over each conductor. The active areas of the piezoceramic sheet are defined by electric fields between the active electrode segments and the first electrode when voltage is applied through each conductor.

What is claimed is:

1. A method of making an inkjet printhead comprising:
    depositing a first metallic electrode and a second metallic electrode over a top surface and a bottom surface, respectively, of a piezoceramic plate;
    segmenting the second metallic electrode into a plurality of disconnected electrode segments;
    positioning a diaphragm over a plurality of pressure chambers, wherein the diaphragm includes a chamber-shaped conductor positioned over each chamber; and
    attaching the piezoceramic plate to the diaphragm such that each conductor on the diaphragm faces multiple electrode segments.

2. A method as recited in claim 1, wherein the segmenting comprises etching the second metallic electrode through patterned openings in a resist layer formed by photolithography.

3. A method as recited in claim 1, wherein the segmenting comprises forming a grid pattern of electrode segments where each electrode segment is of equal size and shape.

4. A method as recited in claim 1, wherein the attaching comprises adhering the piezoceramic plate to the diaphragm with a conductive anisotropic adhesive.

5. A method as recited in claim 1, wherein the depositing comprises depositing first and second metallic electrodes of chromium, nickel and gold to a thickness of 0.5 microns.

6. A method as recited in claim 1, wherein the chamber-shaped conductors dictate active areas of the piezoceramic plate through electrical access to electrode segments positioned directly above a respective chamber.

7. A method as recited in claim 1, wherein the segmenting comprises heating the second metallic electrode to segregate metal material into discontinuous electrode segments.

* * * * *

UNITED STATES PATENT AND TRADEMARK OFFICE
CERTIFICATE OF CORRECTION

PATENT NO.      : 8,567,027 B2
APPLICATION NO. : 13/346289
DATED           : October 29, 2013
INVENTOR(S)     : Tony S Cruz-Uribe et al.

Page 1 of 1

It is certified that error appears in the above-identified patent and that said Letters Patent is hereby corrected as shown below:

On the Title page, in item (75), Inventors, in column 1, line 2,
delete "Kurl" and insert -- Kurt --, therefor.

Signed and Sealed this
Twenty-eighth Day of January, 2014

Michelle K. Lee
*Deputy Director of the United States Patent and Trademark Office*